(12) United States Patent
Kang et al.

(10) Patent No.: US 10,075,307 B1
(45) Date of Patent: Sep. 11, 2018

(54) ADJUSTABLE SIGNAL EQUALIZATION DEVICE AND ADJUSTMENT METHOD THEREOF

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Chen-Yang Pan, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/859,731

(22) Filed: Jan. 1, 2018

(30) Foreign Application Priority Data

Oct. 11, 2017 (CN) .......................... 2017 1 0940356

(51) Int. Cl.
  *H04L 25/03* (2006.01)
  *H03H 11/04* (2006.01)
  *H03H 17/00* (2006.01)

(52) U.S. Cl.
  CPC ....... *H04L 25/03006* (2013.01); *H03H 11/04* (2013.01); *H03H 17/0009* (2013.01)

(58) Field of Classification Search
  CPC ......... H04L 25/03006; H04L 25/03878; H04L 25/03885; H04L 25/03891; H04L 25/03987; H03H 17/0009; H03H 11/04

USPC .......................... 375/229, 232, 233, 234, 236
  See application file for complete search history.

(56) References Cited

U.S. PATENT DOCUMENTS

| | | | | |
|---|---|---|---|---|
| 5,257,286 | A | * 10/1993 | Ray | H04L 25/03019 330/254 |
| 9,432,222 | B2 | * 8/2016 | Gomez | H04L 25/03343 |
| 9,768,985 | B2 | * 9/2017 | Ciacci | H04L 27/368 |
| 2012/0044983 | A1 | * 2/2012 | Kerr | H04L 25/03057 375/233 |
| 2013/0064271 | A1 | * 3/2013 | van de Beek | H04L 25/0266 375/219 |

* cited by examiner

*Primary Examiner* — Siu Lee
(74) *Attorney, Agent, or Firm* — CKC & Partners Co., Ltd.

(57) ABSTRACT

An adjustable signal equalization device includes an equalizer circuitry, an analog-to-digital converter (ADC), a calculation circuitry, and a comparator circuitry. The equalizer circuitry has a transfer function, and processes an input signal based on the transfer function to generate an output signal. The ADC generates a digital signal according to the output signal. The calculation circuitry performs an accumulation according to the first digital signal to generate a first accumulated value and a second accumulated value, and generates a first detection signal and a second detection signal according to the first accumulated value and the second accumulated value. The comparator circuitry compares the first detection signal with the second detection signal to output a control signal to the equalizer circuit if the first detection signal is different from the second detection signal, in order to adjust the transfer function.

20 Claims, 4 Drawing Sheets

ADJUSTABLE SIGNAL EQUALIZATION DEVICE AND ADJUSTMENT METHOD THEREOF

CROSS-REFERENCE TO RELATED APPLICATION

This application claims priority to China Application Serial Number 201710940356.7, filed Oct. 11, 2017, which is herein incorporated by reference.

BACKGROUND

Technical Field

The present disclosure relates to an equalizer. More particularly, the present disclosure relates to an adjustable signal equalization device and an adaptive adjustment method thereof.

Description of Related Art

An equalizer is commonly used in data transmission interfaces, in order to compensate channel degradations and to reduce inter-symbol interference (ISI). In some approaches, a detection mechanism, which is implemented with analog circuits, may be employed to adjust a transfer function of the equalizer. However, in these approaches, the detection mechanism is easily affected by variations of process, voltage, or temperature, resulting in an error in the transfer function of the equalizer.

Alternatively, in some other approaches, a detection mechanism for detecting signal edges may be employed to adjust a transfer function of the equalizer. However, in these approaches, with the increment in the operation speed or in the complexity of the signal, the circuit requirement for this detection mechanism is too high to be reached.

SUMMARY

To address at least problem discussed above, in some aspects, the disclosure provides an adjustable signal equalization device. The adjustable signal equalization device includes an equalizer circuitry, an analog-to-digital converter, a calculation circuitry, and a comparator circuitry. The equalizer circuitry has a transfer function and is configured to process an input signal based on the transfer function, in order to generate an output signal. The analog-to-digital converter is configured to generate a first digital signal according to the output signal. The calculation circuitry is configured to perform an accumulation according to the first digital signal to generate a first accumulated value and a second accumulated value, and is configured to generate a first detection signal and a second detection signal according to the first accumulated value and the second accumulated value. The comparator circuitry is configured to compare the first detection signal with the second detection signal, and is configured to output a control signal to the equalizer circuitry to adjust the transfer function if the first detection signal is different from the second detection signal.

In some aspects, the disclosure provides an adjustment method for adjusting a transfer function of an equalizer circuitry. The adjustment method includes following operations: converting, by an analog-to-digital converter, an output signal outputted from the equalizer circuitry into a first digital signal; accumulating, by a calculation circuitry, the first digital signal to generate a first accumulated value and a second accumulated value, and generating a first detection signal and a second detection signal according to the first accumulated value and the second accumulated value; and comparing, by a comparator circuitry, the first detection signal with the second detection signal, and outputting a control signal to the equalizer circuitry to adjust the transfer function if the first detection signal is different from the second detection signal.

As discussed above, the adjustable signal equalization device and the adjustment method provided in the present disclosure are able to be implemented with simple operations and digital circuits, in order to reduce complexity of ICs and to reduce impacts from the process, the voltage, and the temperature (PVT) variations, on the transfer function.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In this document, the term "coupled" may also be termed as "electrically coupled", and the term "connected" may be termed as "electrically connected". "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
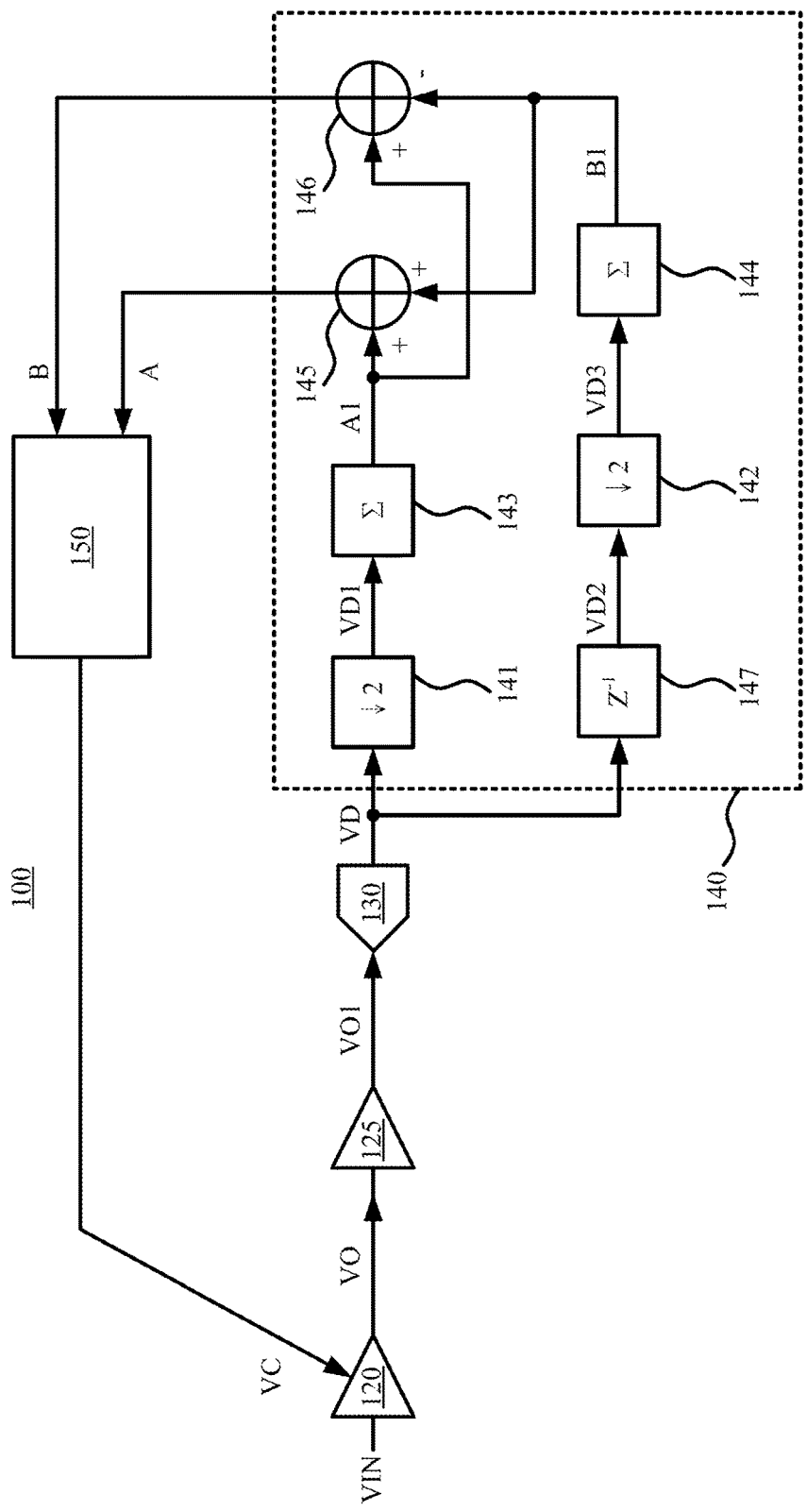
FIG. 1 is a schematic diagram of an adjustable signal equalization device, according to some embodiments of the present disclosure.

Reference is now made to FIG. 1. FIG. 1 is a schematic diagram of an adjustable signal equalization device 100, according to some embodiments of the present disclosure. In some embodiments, the adjustable signal equalization device 100 may be applied to a system of Serializer/Deserializer (SerDes), but the present disclosure is not limited thereto.

In some embodiments, the adjustable signal equalization device 100 includes an equalizer circuitry 120, an analog-to-digital converter 130, a calculation circuitry 140, and a comparator circuitry 150. The equalizer circuitry 120 is configured to adjust a transfer function thereof according to a control signal VC, and to process an input signal VIN based on this transfer function, in order to generate an output signal VO. The input signal VIN may be data or a signal transmitted from a transmitter (not shown) through a channel (not shown). In general, a frequency response of the channel is a low-pass function. In other words, signal components having higher frequency of the input signal VIN will be degraded due to the channel. In some embodiments, to compensate this degradation, the transfer function of the equalizer circuitry 120 is set to be a high-pass function (as shown in FIG. 2B below). In some embodiments, the transfer function discussed in this disclosure is a frequency response between an input and an output of the equalizer circuitry 120.

The analog-to-digital converter 130 is coupled to the equalizer circuitry 120, in order to generate a digital signal VD according to the output signal VO. In some embodiments, as shown in FIG. 1, the adjustable signal equalization device 100 further includes an amplifier 125. The amplifier 125 is configured to amplify the output signal VO to generate an output signal VO1, and the analog-to-digital converter 130 is configured to convert the output signal VO1 into the digital signal VD. In some embodiments, the amplifier 125 may be implemented with a variable gain amplifier, in which the gain of the amplifier 125 may be adjusted according to specifications (for example, input voltage range) of the analog-to-digital converter 130.

The calculation circuitry 140 is coupled to the analog-to-digital converter 130 to receive the digital signal VD. The calculation circuitry 140 is configured to perform an accumulation based on the digital signal VD, in order to generate a detection signal A and a detection signal B.

In some embodiments, the calculation circuitry 140 includes frequency reduction circuits 141-142, accumulator circuits 143-144, arithmetic circuits 145-146, and a delay circuit 147.

The frequency reduction circuit 141 is configured to down sample the digital signal VD, in order to generate the digital signal VD1. For example, the frequency reduction circuit 141 is configured to reduce the sample rate of the digital signal VD by a factor of 2, in order to generate the digital signal VD1. The accumulator circuit 143 is coupled to the frequency reduction circuit 141 to receive the digital signal VD1. The accumulator circuit 143 performs an accumulation according to the digital signal VD1, in order to generate an accumulated value A1.

The delay circuit 147 is coupled to the analog-to-digital converter 130 to receive the digital signal VD. The delay circuit 147 is configured to delay the digital signal VD for a predetermined time, in order to generate a digital signal VD2. In some embodiments, the delay circuit 147 may be implemented with an integrator and/or one or more inverters that are coupled in series, but the present disclosure is not limited thereto. The frequency reduction circuit 142 is configured to down sample the digital signal VD2, in order to generate a digital signal VD3. For example, the frequency reduction circuit 142 is configured to reduce a sample rate of the digital signal VD2 by a factor of 2, in order to generate the digital signal VD3. The accumulator circuit 144 is coupled to the frequency reduction circuit 142 to receive the digital signal VD3. The accumulator circuit 144 is configured to perform an accumulation according to the digital signal VD3, in order to generate an accumulated value B1. In some embodiments, the accumulator circuit 143 and 144 may be implemented with logic circuits, which includes, a register and/or an adder, but the present disclosure is not limited thereto.

The arithmetic circuit 145 is configured to add the accumulated value A1 and the accumulated value B1, in order to generate the detection signal A. The arithmetic circuit 146 is configured to subtract the accumulated value B1 from the accumulated value A1, in order to generate the detection signal B. In some embodiments, the arithmetic circuit 145 and the arithmetic circuit 146 may be implemented with adders.

The idea of designing the calculation circuitry 140 in the above embodiments will be described in view of the concept of the frequency domain. If the digital signal VD is processed by using an fast Fourier transform (FFT), it is able to derive the following equation, in which N is a positive number and indicates a number of sampling points, k indicates a k-th sampling point in frequency domain (i.e., corresponding to a sine wave having a k-th frequency), and, $W_N$ indicates an N-th root of unity:

$$X(k) = \sum_{n=0}^{N-1} x(n) \cdot W_N^{nk} (k = 0, 1, \ldots, N-1)$$

$$W_N = e^{-j\left(\frac{2\pi}{N}\right)}$$

It is able to derive the following equation (1) if k in the above equation is equal to zero:

$$X(0) = \sum_{n=0}^{N-1} x(n) = x(0) + x(1) + \ldots + x(N-1) \quad (1)$$

From the equation (1), it is understood that, in the frequency domain, if all digital signals VD are accumulated, signal components having DC frequency in the digital signal VD can be equivalently obtained.

Alternatively, if k=N/2, X(k) is derived as:

$$X(N/2) = \sum_{n=0}^{N-1} x(n) \cdot (-1)^n = x(0) - x(1) + x(2) - x(3) + \ldots \quad (2)$$

In the frequency domain, if differences between two successive digital signals VD are accumulated, the above equation (2) can be equivalently obtained. Compared with the equation (1), in the higher frequency components of the digital signal VD are present in the equation (2).

In the above equations (1) and (2), it is able to be divided into even-numbered factors (i.e., x(0), x(2), etc.) and odd-numbered factors (i.e., x(1), x(3), . . . , etc.). In some embodiments, the accumulated A1, which is obtained by using the frequency reduction circuit 141 and the accumulator circuit 143 to process the input signal VD, is substantially equal to a sum of the even-numbered factors. In other words, in view of the frequency domain, the accumulated value A1 is substantially equal to x(0)+x(2)+x(4)+ . . . .

Similarly, in some embodiments, the accumulated B1, which is obtained by using the delay circuit 147, the frequency reduction circuit 142, and the accumulator circuit 144 to process the input signal VD, is substantially equal to a sum of the odd-numbered factors. In other words, in view of the frequency domain, the accumulated value B1 is substantially equal to x(1)+x(3)+x(5)+ . . . .

Accordingly, in the frequency domain, the detection signal A, which is obtained by adding the accumulated value A1 and the accumulated value B1, is substantially equal to the equation (1). The detection signal B, which is obtained by subtracting the accumulated value B1 from the accumulated value A1, is substantially equal to the equation (2). The detection signal A is associated with signal components having low frequency (i.e., DC frequency) of the digital signal VD, and the detection signal B is associated with signal components having high frequency of the digital signal VD. As a result, by comparing the power of the detection signal A with the power of the detection signal B, it is able to determine whether the equalizer circuitry 120 is in an over equalization condition or in an under equalization condition.

With continued reference to FIG. 1, the comparator circuitry 150 is coupled to the calculation circuitry 140 to receive the detection signal A and the detection signal B. The comparator circuitry 150 is configured to determine the power of the detection signal A and the power of the detection signal B, and to compare the powers of these signals to output the control signal VC, in order to adjust the transfer function of the equalizer circuitry 120. In some embodiments, the comparator circuitry 150 is configured to take an absolute value of the detection signal A to determine the power of the detection signal A, and to take an absolute value of the detection signal B to determine the power of the detection signal B, but the present disclosure is not limited thereto. In some embodiments, the comparator circuitry 150 may be implemented with an arithmetic circuit and a comparator, in order to perform the operations above. Alternatively, in some embodiments, the comparator circuitry 150 may be implemented with digital signal processing circuits, in order to perform the operations above. The arrangements of the comparator circuitry 150 are given for illustrative purposes, and the present disclosure is not limited thereto.

For example, if the power of the detection signal A is greater than the power of the detection signal B, it indicates that the power of the low frequency signal is greater than the power of the high frequency signal. Under this condition, a gain, at the high frequency, of the transfer function of the equalizer circuitry 120 can be increased, or a gain, at the low frequency, of the transfer function of the equalizer circuitry 120 can be decreased, in order to adjust the equalization of the equalizer circuitry 120. Alternatively, if the power of the detection signal B is greater than the power of the detection signal A, it indicates that the power of the high frequency signal is greater than the power of the low frequency signal. Under this condition, the gain, at the low frequency, of the transfer function of the equalizer circuitry 120 can be increased, or the gain, at the high frequency, of the transfer function of the equalizer circuitry 120 can be decreased, in order to adjust the equalization of the equalizer circuitry 120.

In some embodiments, the calculation circuitry 140 and the comparator circuitry 150 may be implemented with a micro-controller, a digital signal processing circuit, or an application-specific integrated circuit (ASIC). The implementations of the calculation circuitry 140 are given for illustrative purposes, and the present disclosure is not limited thereto. For example, in some other embodiments, the calculation circuitry 140 may directly perform the calculations of the equations (1) and (2) according to the digital signal VD to generate the detection signal A and the detection signal B.

In some embodiments, the adjustable signal equalization device 100 further includes a low-pass filter (not shown). The low-pass filter is coupled between the comparator circuitry 150 and the equalizer circuitry 120. In some embodiments, the low-pass filter adjusts the transfer function of the equalizer circuitry 120 if an accumulation of the control signal VC is greater than a reference value. Thus, it is able to prevent the equalizer circuitry 120 from being over-equalized during operations.

In some related approaches, a mechanism for detecting edges of signals is utilized to determine whether an equalizer is the over equalization condition or in the under equalization condition. In these approaches, with a complexity of the form of the signals (e.g., PAM4 or PAM8 encoding, etc.) or the operating speed of the circuits is increased, the requirement for implementing this mechanism becomes higher and higher. As a result, the power of the equalizer would be too high and the circuit area would be too big.

Compared with the above approaches, the present disclosure utilizes the concept of the frequency domain to implement the calculation circuitry 140, in which the operations of the calculation circuitry 140 are able to be implemented with simple operations (e.g., adding and subtracting operations) and digital circuits. Accordingly, the requirement of the calculation circuitry 140 may be lower. In addition, by using digital processing, the comparator circuitry 150 is able to determine the power by taking the absolute value. As a result, an analog power detector is able to be omitted. Accordingly, impacts introduced from process, voltage, or temperature variations on the calculation circuitry 140 and the comparator circuitry 150 can be lower.

Figure 2A:
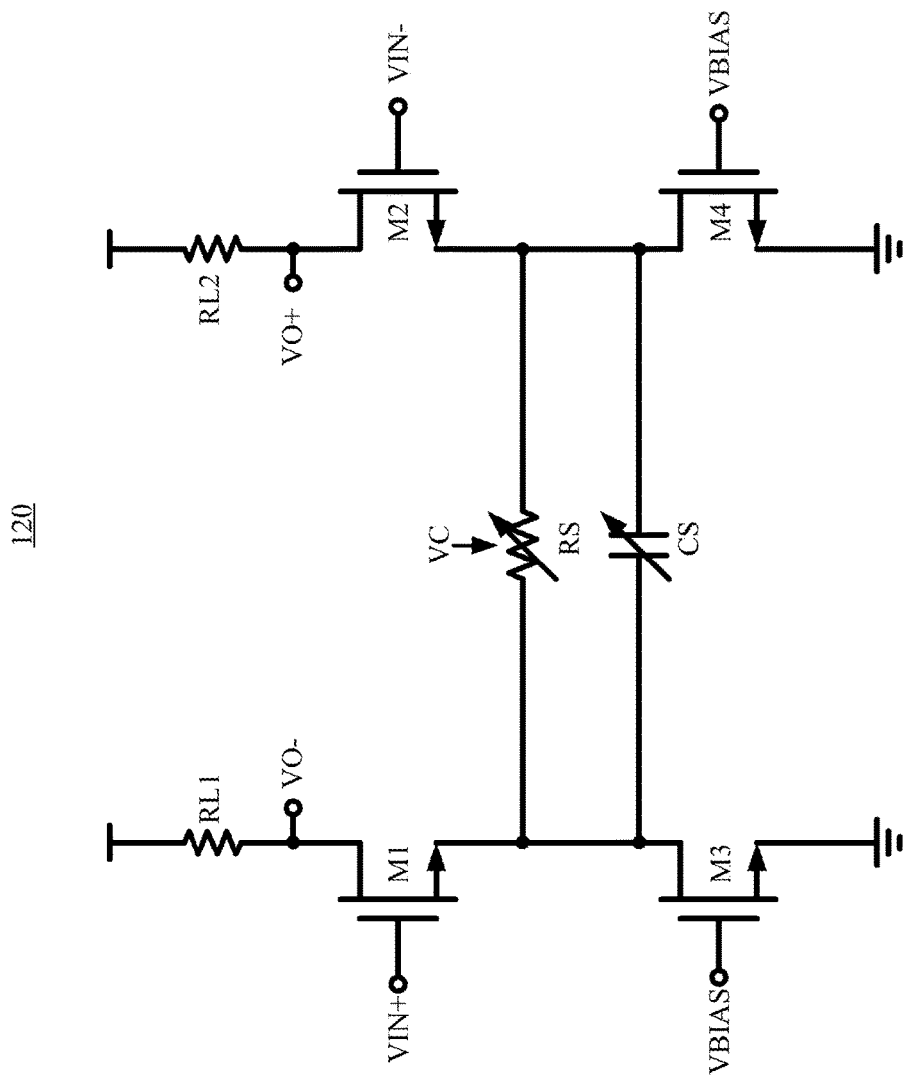
FIG. 2A is a circuit diagram of the equalizer circuitry in FIG. 1, according to some embodiments of the present disclosure.
Figure 2B:
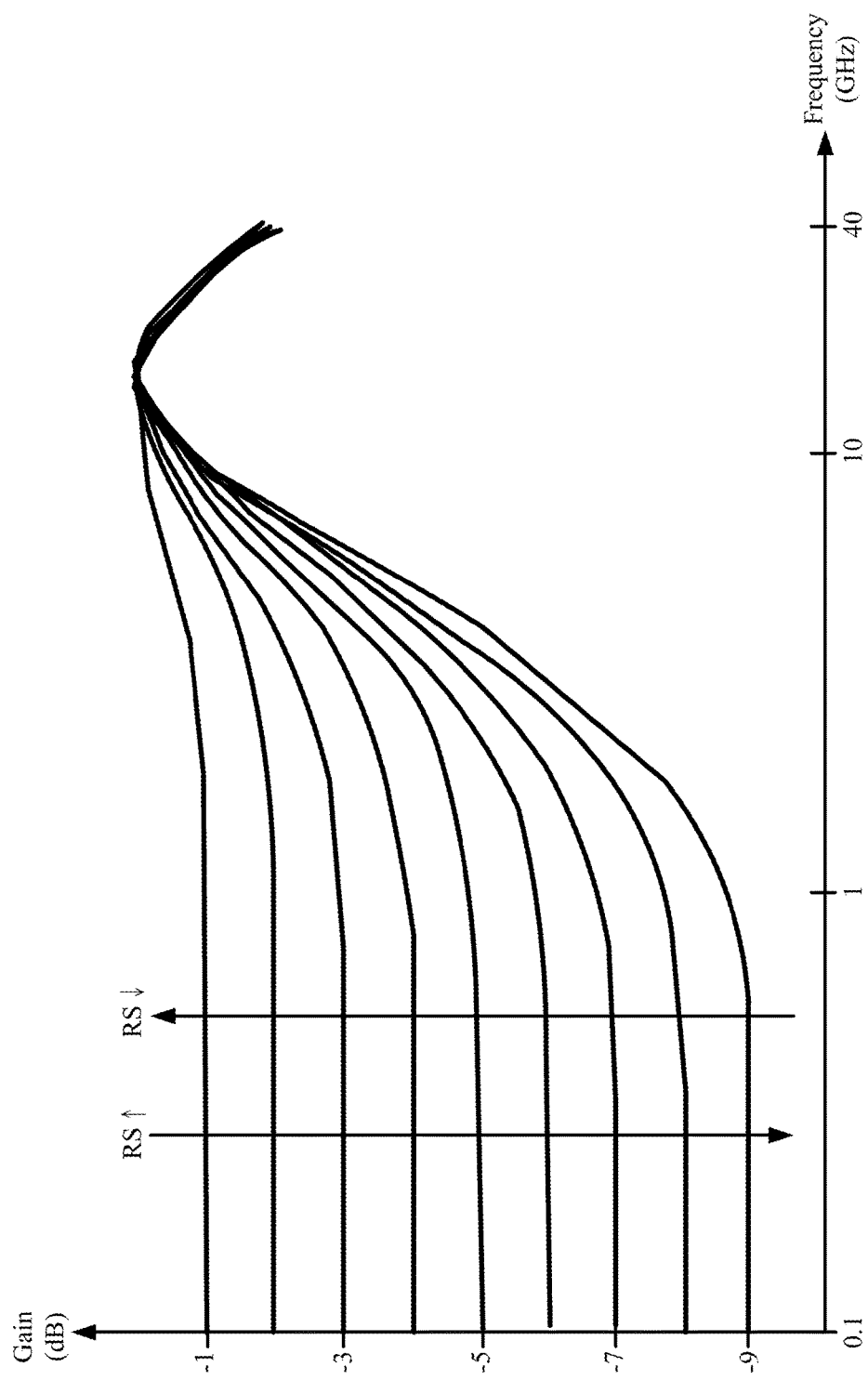
FIG. 2B is a schematic diagram illustrating a transition in the transfer function of the equalizer circuitry in FIG. 2A, according to some embodiments of the present disclosure.

Reference is now made to FIG. 2A. FIG. 2A is a circuit diagram of the equalizer circuitry 120 in FIG. 1, according to some embodiments of the present disclosure. In this example, the input signal VIN in FIG. 1 is a set of fully differential input signals VIN+ and VIN−, and the output signal VO in FIG. 1 is a set of fully differential output signals VO+ and VO−.

In this example, the equalizer circuitry 120 includes transistors M1-M4, a variable resistor RS, a variable capacitor CS, and load resistors RL1-RL2. A first terminal of the transistor M1 is coupled to the load resistor RL1, a second terminal of the transistor M1 is coupled to a first terminal of the transistor M3, and a control terminal of the transistor M1 is configured to receive the input signal VIN+. A first terminal of the transistor M2 is coupled to the load resistor RL2, a second terminal of the transistor M2 is coupled to a first terminal of the transistor M4, and a control terminal of the transistor M2 is configured to receive the input signal VIN−. Second terminals of the transistors M3 and M4 are coupled to ground, and control terminals of the transistors M3 and M4 are configured to receive a bias voltage VBIAS.

The variable resistor RS and the variable capacitor CS are coupled in parallel and between the second terminal of the transistor M1 and the second terminal of the transistor M2. In some embodiments, at least one of the variable resistor RS and the variable capacitor CS is configured to be controlled by the control signal VC shown in FIG. 1. For example, in some embodiments, the capacitance value of the variable capacitor CS is set to be fixed, and the resistance value of the variable resistor RS is configured to be adjusted by the control signal VC. In some embodiments, the resistance value of the variable resistor RS is set to be fixed, and the capacitance value of the variable capacitor CS is configured to be adjusted by the control signal VC. Alternatively, in some other embodiments, both of the resistance value of the variable resistor RS and the capacitance value of the variable capacitor CS are adjusted by one or more control signals VC.

In some embodiments, the variable resistor RS may be implemented with a switched resistor array. In some embodiments, the variable resistor RS may be implemented with a voltage-controlled resistor which may be implemented with a transistor. In some embodiments, the variable capacitor CS may be implemented with a switched capacitor array. In some embodiments, the variable capacitor CS may be implemented with a voltage-controlled capacitor which may be implemented with a transistor. The implementations of the components are given for illustrative purposes, and various suitable implementations are within the contemplated scope of the present disclosure.

Reference is now made to both of FIG. 2A and FIG. 2B. FIG. 2B is a schematic diagram illustrating transitions in the transfer function of the equalizer circuitry 120 in FIG. 2A, according to some embodiments of the present disclosure. For ease of understanding, in the example of FIG. 2B, the resistance value of the variable resistor RS is configured to be adjusted based on the control signal VC, and the capacitance value of the variable capacitor CS is set to be fixed. The gain, at low frequency, of the transfer function of the equalizer circuitry 120 is associated with the variable resistor RS. For example, if the resistance value of the variable resistor RS is increased, the gain, at low frequency, of the transfer function of the equalizer circuitry 120 is reduced. Alternatively, if the resistance value of the variable resistor RS is reduced, the gain, at low frequency, of the transfer function of the equalizer circuitry 120 is increased.

Accordingly, if the power of the detection signal A is greater than the power of the detection signal B, it indicates that the power of the low frequency signal is greater than the power of the high frequency signal. Under this condition, the comparator circuitry 150 outputs the corresponding control signal VC to increase the resistance value of the variable resistor RS, in order to decrease the gain, at low frequency, of the transfer function of the equalizer circuitry 120.

Alternatively, if the power of the detection signal B is greater than the power of the detection signal A, it indicates that the power of the high frequency signal is greater than the power of the low frequency signal. Under this condition, the comparator circuitry 150 outputs the corresponding control signal VC to decrease the resistance value of the variable resistor RS, in order to increase the gain, at low frequency, of the transfer function of the equalizer circuitry 120.

The equalizer circuitry 120 shown in FIG. 2A is given for illustrative purposes, and other types of the equalizer circuits are also within the contemplated scope of the present disclosure.

Figure 3:
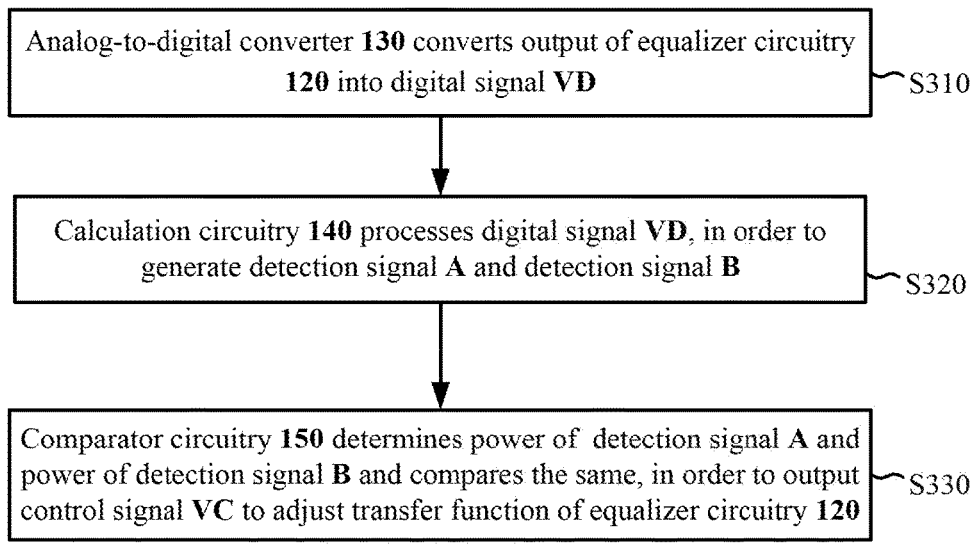
FIG. 3 is a flow chart of an adjustment method, according to some embodiments of the present disclosure.

Reference is now made to FIG. 3. FIG. 3 is a flow chart of an adjustment method 300, according to some embodiments of the present disclosure. For ease of illustration, the operations of the adjustable signal equalization device 100 are described with reference to FIG. 1 and FIG. 3. In some embodiments, the adjustment method 300 includes operations S310, S320, and S330.

In operation S310, the analog-to-digital converter 130 converts the output of the equalizer circuitry 120 into the digital signal VD. For illustration, as shown in FIG. 1, the output signal VO of the equalizer circuitry 120 is converted by the analog-to-digital converter 130 into the digital signal VD.

In operation S320, the calculation circuitry 140 processes the digital signal VD, in order to generate the detection signal A and the detection signal B. For illustration, the calculation circuitry 140 is able to generate the detection signal A and the detection signal B according to the arrangement shown in FIG. 1. Alternatively, the calculation circuitry 140 may directly process the digital signal VD according to the equations (1) and (2), in order to generate the detection signal A and the detection signal B.

In operation S330, the comparator circuitry 150 determines the power of the detection signal A and the power of the detection signal B and compares the same, in order to output the control signal VC to adjust the transfer function of the equalizer circuitry 120.

For illustration, as shown in FIG. 1, the comparator circuitry 150 may obtain the absolute values of the detection signals A and B, in order to determine the power of the detection signal A and the power of the detection signal B, respectively. As described above, if the power of the detection signal A is greater than the power of the detection signal B, the gain, at high frequency, of the transfer function of the equalizer circuitry 120 may be increased, or the gain, at low frequency, of the transfer function of the equalizer circuitry 120 may be decreased. Alternatively, if the power of the detection signal B is greater than the power of the detection signal A, the gain, at low frequency, of the transfer function of the equalizer circuitry 120 can be increased, or the gain, at high frequency, of the transfer function of the equalizer circuitry 120 can be decreased.

The above description of the adjustment method 300 includes exemplary operations, but the operations of the adjustment method 300 are not necessarily performed in the order described above. The order of the operations of the adjustment method 300 can be changed, or the operations can be executed simultaneously or partially simultaneously as appropriate, in accordance with the spirit and scope of various embodiments of the present disclosure.

As discussed above, the adjustable signal equalization device and the adjustment method provided in the present disclosure are able to be implemented with simple operations and digital circuits, in order to reduce the complexity of ICs and to reduce the impacts from the process, the voltage, and the temperature (PVT) variations, on the transfer function.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. An adjustable signal equalization device, comprising:
an equalizer circuitry having a transfer function, the equalizer circuitry configured to process an input signal based on the transfer function, in order to generate an output signal;
an analog-to-digital converter configured to generate a first digital signal according to the output signal;
a calculation circuitry configured to perform an accumulation according to the first digital signal to generate a first accumulated value and a second accumulated value, and configured to generate a first detection signal and a second detection signal according to the first accumulated value and the second accumulated value; and
a comparator circuitry configured to compare the first detection signal with the second detection signal, and configured to output a control signal to the equalizer circuitry to adjust the transfer function if the first detection signal is different from the second detection signal.

2. The adjustable signal equalization device of claim 1, wherein the calculation circuitry comprises a first accumulator circuit configured to accumulate the first digital signal, in order to generate the first accumulated value;
a delay circuit configured to delay the first digital signal, in order to generate a second digital signal; and
a second accumulator circuit configured to accumulate the second digital signal, in order to generate the second accumulated value.

3. The adjustable signal equalization device of claim 2, wherein the calculation circuitry further comprises
a first frequency reduction circuit configured to down sample the first digital signal, in order to generate a third digital signal, wherein the first accumulator circuit is further configured to accumulate the third digital signal to generate the first accumulated value; and
a second frequency reduction circuit configured to down sample the second digital signal, in order to generate a fourth digital signal, wherein the second accumulator circuit is further configured to accumulate the fourth digital signal to generate the second accumulated value.

4. The adjustable signal equalization device of claim 2, wherein the calculation circuitry further comprises:
a first arithmetic circuit configured to add the first accumulated value and the second accumulated value, in order to generate the first detection signal; and
a second arithmetic circuit configured to subtract the second accumulated value from the first accumulated value, in order to generate the second detection signal.

5. The adjustable signal equalization device of claim 4, wherein a fast Fourier transform of the first digital signal is satisfied with a first equation as follows:

$$\begin{cases} X(k) = \sum_{n=0}^{N-1} x(n) \cdot W_N^{nk} \\ W_N = e^{-j\left(\frac{2\pi}{N}\right)} \end{cases},$$

wherein k=0, 1, . . . , N−1, N, N is a positive number and indicates a number of sampling points, $W_N$ indicates an N-th root of unity, the first accumulated value is equal to a sum of odd-numbered factors in the first equation, and the second accumulated value is equal to a sum of even-numbered factors of the first equation.

6. The adjustable signal equalization device of claim 5, wherein the first detection signal, in a frequency domain, is satisfied with the following equation:

$$X(0) = \sum_{n=0}^{N-1} x(n).$$

7. The adjustable signal equalization device of claim 5, wherein the second detection signal, in a frequency domain, is satisfied with the following equation:

$$X(N/2) = \sum_{n=0}^{N-1} x(n) \cdot (-1)^n.$$

8. The adjustable signal equalization device of claim 1, wherein the comparator circuitry is configured to take an absolute value of the first detection signal to determine a first power of the first detection signal, and configured to take an absolute value of the second detection signal to determine a second power of the second detection signal, in order to output the control signal according to a comparison result of the first power and the second power.

9. The adjustable signal equalization device of claim 1, further comprising:
an amplifier configured to amplify the output signal, wherein the analog-to-digital converter is further configured to generate the first digital signal according to the amplified output signal.

10. An adjustment method for adjusting a transfer function of an equalizer circuitry, the adjustment method comprising:
converting, by an analog-to-digital converter, an output signal outputted from the equalizer circuitry into a first digital signal;
accumulating, by a calculation circuitry, the first digital signal to generate a first accumulated value and a second accumulated value, and generating a first detection signal and a second detection signal according to the first accumulated value and the second accumulated value; and
comparing, by a comparator circuitry, the first detection signal with the second detection signal, and outputting a control signal to the equalizer circuitry to adjust the transfer function if the first detection signal is different from the second detection signal.

11. The adjustment method of claim 10, wherein generating the first detection signal and the second detection signal comprises:
accumulating, by a first accumulator circuit of the calculation circuitry, the first digital signal, in order to generate the first accumulated value;
accumulating, by a delay circuit of the calculation circuitry, the first digital signal, in order to generate a second digital signal; and
accumulating, by a second accumulator circuit of the calculation circuitry, the second digital signal, in order to generate the second accumulated value.

12. The adjustment method of claim 11, wherein generating the first detection signal and the second detection signal further comprises:
down sampling, by a first frequency reduction circuit of the calculation circuitry, the first digital signal, in order to generate a third digital signal, wherein the first accumulator circuit is further configured to accumulate the third digital signal to generate the first accumulated value; and
down sampling, by a second frequency reduction circuit of the calculation circuitry, the second digital signal, in order to generate a fourth digital signal, wherein the second accumulator circuit is further configured to accumulate the fourth digital signal to generate the second accumulated value.

13. The adjustment method of claim 10, wherein generating the first detection signal and the second detection signal further comprises:
adding, by a first arithmetic circuit of the calculation circuitry, the first accumulated value and the second accumulated value, in order to generate the first detection signal; and
subtracting, by a second arithmetic circuit of the calculation circuitry, the second accumulated value from the first accumulated value, in order to generate the second detection signal.

14. The adjustment method of claim 13, wherein a fast Fourier transform of the first digital signal is satisfied with a first equation as follows:

$$\begin{cases} X(k) = \sum_{n=0}^{N-1} x(n) \cdot W_N^{nk} \\ W_N = e^{-j\left(\frac{2\pi}{N}\right)} \end{cases},$$

wherein k=0, 1, . . . , N−1, N, N is a positive number and indicates a number of sampling points, $W_N$ indicates an N-th root of unity, the first accumulated value is equal to a sum of odd-numbered factors in the first equation, and the second accumulated value is equal to a sum of even-numbered factors of the first equation.

15. The adjustment method of claim 14, wherein the first detection signal, in a frequency domain, is satisfied with the following equation:

$$X(0) = \sum_{n=0}^{N-1} x(n).$$

16. The adjustment method of claim 14, wherein the second detection signal, in a frequency domain, is satisfied with the following equation:

$$X(N/2) = \sum_{n=0}^{N-1} x(n) \cdot (-1)^n.$$

17. The adjustment method of claim 10, wherein comparing the first detection signal with the second detection signal comprises:
    taking an absolute value of the first detection signal to determine a first power of the first detection signal; and
    taking an absolute value of the second detection signal to determine a second power of the second detection signal.

18. The adjustment method of claim 17, wherein outputting the control signal comprises:
    outputting the control signal according to a comparison result of the first power and the second power.

19. The adjustment method of claim 18, wherein the comparison result indicates whether the equalizer circuitry is in an over-equalization condition or in an under-equalization condition.

20. The adjustment method of claim 10, further comprising:
    amplifying, by an amplifier, the output signal, wherein the analog-to-digital converter is further configured to generate the first digital signal according to the amplified output signal.

* * * * *